United States Patent [19]

Tsunozaki et al.

[11] Patent Number: 5,440,521
[45] Date of Patent: Aug. 8, 1995

[54] SEMICONDUCTOR INTEGRATED CIRCUIT DEVICE

[75] Inventors: Manabu Tsunozaki, Kodaira; Kyoko Ishii, Hamura; Koichi Nozaki, Chitose; Hiroshi Yoshioka, Akishima; Yoshihisa Koyama, Akishima; Shinji Udo, Akishima; Hidetomo Aoyagi, Akishima; Sinichi Miyatake, Akishima; Makoto Morino, Akishima; Akihiko Hoshida, Fussa, all of Japan

[73] Assignees: Hitachi, Ltd.; Hitachi VLSI Engineering Corp., both of Tokyo; Hitachi Hokkai Semiconductor, Ltd., Hokkaido, all of Japan

[21] Appl. No.: 109,071

[22] Filed: Aug. 19, 1993

[30] Foreign Application Priority Data

Aug. 19, 1992 [JP] Japan .................................. 4-242751

[51] Int. Cl.⁶ ........................................... H01L 27/10
[52] U.S. Cl. ........................... 365/230.03; 365/230.01; 365/230.02; 365/230.06; 365/231; 365/189.08
[58] Field of Search .................... 365/230.03, 230.01, 365/51, 63, 230.02, 230.06, 231, 189.01, 189.08

[56] References Cited

U.S. PATENT DOCUMENTS

| 5,018,100 | 5/1991 | Yanagisawa | 365/230.03 |
| 5,021,998 | 6/1991 | Suzuki et al. | 365/51 |
| 5,150,325 | 9/1992 | Yanagisawa et al. | 365/177 |

FOREIGN PATENT DOCUMENTS 61-199297 9/1986 Japan .
63-173297 7/1988 Japan .
3-40953 2/1991 Japan .

OTHER PUBLICATIONS

"16-Mbit DRAM Specifications Will be Decided on For Sample Shipments in 1990", *Nikkei Microdevices*, Mar. 1, 1988, pp. 67–81. (with translation).

Primary Examiner—Viet Q. Nguyen
Attorney, Agent, or Firm—Antonelli, Terry, Stout & Kraus

[57] ABSTRACT

A semiconductor integrated circuit device constituted by a plurality of sets each of which having a pair of memory mats and each memory mat having a plurality of memory cells arranged in a matrix and a sense amplifier, I/O lines for transmitting signals provided by the sense amplifiers, selecting circuitry for selecting either a condition for sending out the signals provided by the sense amplifiers on the I/O lines or a condition for not sending out the same on the I/O lines, and Y-selection lines for transmitting the selection signals. A decoder connected with selection is disposed substantially at the middle of the Y-selection lines. X- and Y-address buffers are disposed close to each other nearer to the center of the chip than X- and Y-redundant circuits. A reference voltage generating circuit is disposed nearer to the edge of the chip than an output buffer circuit. A relief selecting circuit of each memory mat is formed adjacent to a redundant line selecting circuits included in the same memory mat. At least some of wiring lines connected to each sense amplifier are formed in a wiring layer in which Y-selection lines are formed. The Y-selection lines are extended in gaps between the sense amplifiers.

13 Claims, 12 Drawing Sheets

FIG. 1  CHIP LAYOUT
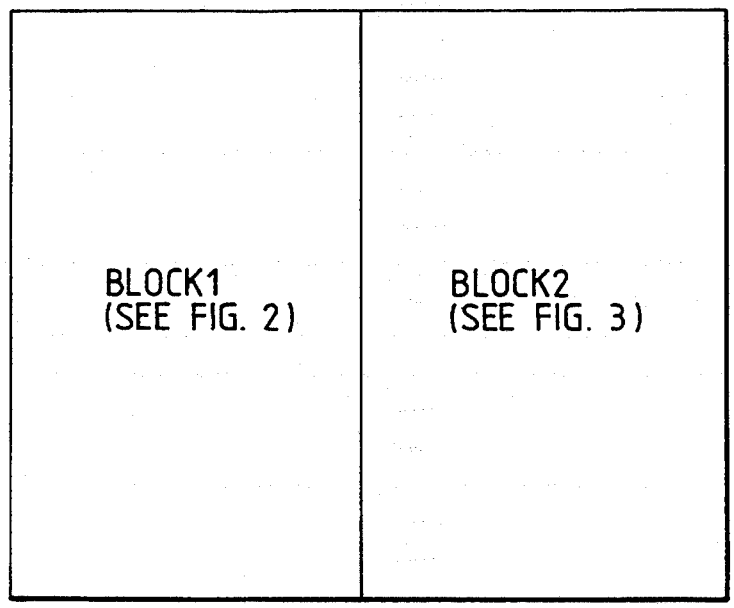
FIG. 4  X-REDUNDANCY CIRCUIT
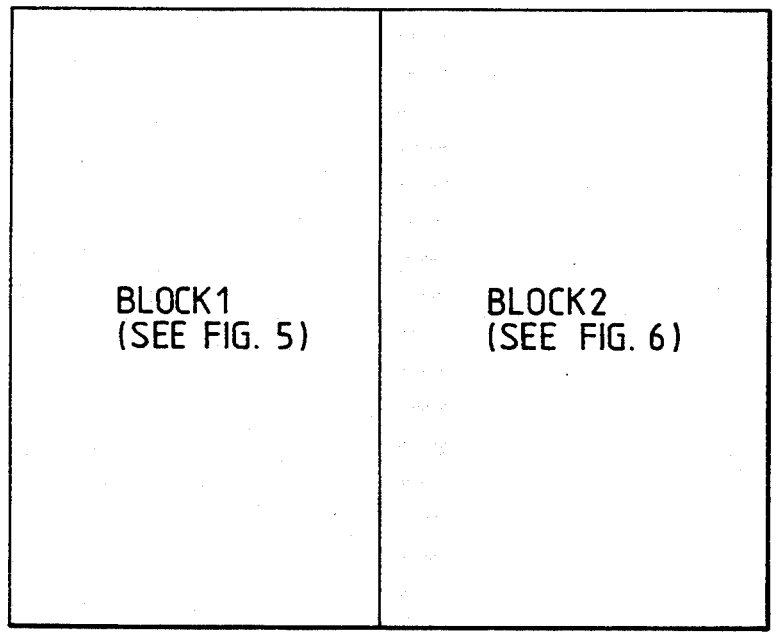

SEMICONDUCTOR INTEGRATED CIRCUIT DEVICE

BACKGROUND OF THE INVENTION

The present invention relates to a semiconductor integrated circuit device, such as a dynamic read-and-write memory (hereinafter abbreviated to "DRAM") having a large storage capacity, such as 16 Mb.

Efforts have been made to develop DRAMs having a large storage capacity, such as 16 Mb. One of recently developed DRAMs having such a large storage capacity is published in "Nikkei Microdevices", Nikkei Mac-Graw-Hill Co., pp. 67–81, Mar. 1, 1988.

Increase in the read cycle time and the write cycle time due to the very narrow wiring lines, very small intervals between the wiring lines and the miniaturized component elements is a problem when forming a DRAM having a large storage capacity in a small IC chip. For example, since the Y-selection lines have a high resistance, the selection of the sense amplifier further from the Y-decoder takes longer time. Since a limited number of narrow wiring lines are available for the peripheral circuit, the wiring lines must be formed along the shortest paths and the uses of the narrow wiring lines must be determined properly according to their resistances. The inventors of the present invention found through the study of DRAMs having a large capacity that newly developed techniques must be employed in addition to the conventional techniques of constructing a conventional 16 Mb DRAM to realize a DRAM having a large storage capacity of 16 Mb and capable of operating at a sufficiently high operating speed.

An invention pertinent to the present invention is disclosed in Japanese Patent Application No. 3-40953.

SUMMARY OF THE INVENTION

Accordingly, it is an object of the present invention to provide a semiconductor integrated circuit device suitable for forming a semiconductor storage device having a large storage capacity and capable of being formed in a small size.

Another object of the present invention is to provide a semiconductor integrated circuit device having a large storage capacity and capable of stably operating at a high operating speed.

In one aspect of the present invention, a semiconductor integrated circuit device comprises; a plurality of memory blocks of a shared sense amplifier system each having a plurality of sets each of memory mats provided with dynamic memory cells arranged in a matrix and a sense amplifier for amplifying read signals read from the memory cells; a selecting means for selecting either sending out or not sending out the read signal provided by each sense amplifier on an I/O line; Y-selection lines for transmitting selection signals; and a decoding circuit for determining the condition of the Y-selection lines, disposed substantially at the middle of the Y-selection lines. A peripheral circuit is formed in a cross-shaped area consisting of a longitudinal central area longitudinally extending so as to divide the chip into equal right and left sections, and a lateral central area laterally extending so as to divide the chip into equal upper and lower sections. Memory arrays are formed in the four sections separated by the cross-shaped area. An X-address buffer, a Y-address buffer, an X-redundant relief circuit and a Y-redundant relief circuit are arranged in the lateral central area. The X- and Y-address buffers and the X- and Y-redundant relief circuits are disposed close to each other. The semiconductor integrated circuit device is provided with a reference voltage generating circuit for generating a specified reference voltage and an output buffer serving as a voltage follower to provide a supply voltage and a supply current for the operation of the internal circuits. The reference voltage generating circuit and the output buffer are disposed in a peripheral circuit area in the lateral central area. The reference voltage generating circuit is disposed nearer to the edge of the chip than the output buffer. Each memory mat is provided with a plurality of redundant lines. A relief selecting circuit for selecting the redundant lines of the memory mat for relief is disposed adjacent to the same memory mat. At least some of the wiring lines of the sense amplifiers are arranged in a wiring layer including the Y-selection lines, and the Y-selection lines of the same nodes extend through gaps between the sense amplifiers. The same kind of impurity ions as that used for forming the memory cells is used for ion implantation when forming shared MOS transistors and bit line precharging n-channel MOS transistors at the same dose. A plurality of logic circuits of the same kind for generating a plurality of I/O line equalizing signals on the basis of a mat control signal provide the I/O line equalizing signals simultaneously to a plurality of I/O line equalizing circuits included in each memory mat.

In the semiconductor integrated circuit device formed in the foregoing configuration, the distance from the decoder to the far end of the Y-selection line is comparatively short, the Y-selection lines have a comparatively small resistance even if the Y-selection lines are very narrow. Therefore, the chip of the semiconductor integrated circuit can be miniaturized without sacrificing the access time. Since the circuits for controlling access can be disposed near the central portion of the cross-shaped area in which access paths are concentrated, delay in accessing the memory cells can be reduced. Since an internal voltage step-down circuit is disposed nearer to the center of the chip than the reference voltage generating circuit and the internal voltage step-down circuit excluding an internal phase compensating capacitor requiring a large space for arrangement is disposed within the central area of the cross-shaped area, the internal voltage step-down circuit and the reference voltage generating circuit are not affected significantly by an address predecoding signal and coupling noise generated by control signal lines. Since the reference voltage generating circuit, in particular, is formed at a position where the same is hardly subject to coupling noise, circuits capable of operating on a small current can be used and the internal voltage step-down circuit is able to supply power efficiently to the peripheral circuits. The difference between the redundant lines of each memory mat in access time is small. Since the resistance of the Y-selection lines is small even though the gaps between the rows of the sense amplifiers are narrow, the chip can be miniaturized without sacrificing access time. The areas for extending the Y-selection lines can be secured without entailing reduction in data reading margin attributable to the deformation of the symmetrical layout of the sense amplifiers. Increase in the threshold voltage caused by a narrow channel effect due to the miniaturization of the shared MOS transistors and the bit line precharging n-channel MOS transistors through the reduction of intervals between the data lines can be compensated and operation margin can be secured. The wiring channel extending along the longitudinal center line of the chip may be narrow and hence the chip can be miniaturized.

BRIEF DESCRIPTION OF THE DRAWINGS

The above and other objects, features and advantages of the present invention will become more apparent from the following description taken in connection with the accompanying drawings, in which:

FIG. 1 is a view of a chip of a DRAM in a preferred embodiment according to the present invention;

FIG. 4 is a view of an X-redundant circuit in accordance with the present invention;

DESCRIPTION OF THE PREFERRED EMBODIMENTS

The present invention will be described hereinafter with reference to the accompanying drawings, in which reference characteristics are specific to each drawing except when otherwise specified.

Figure 2:
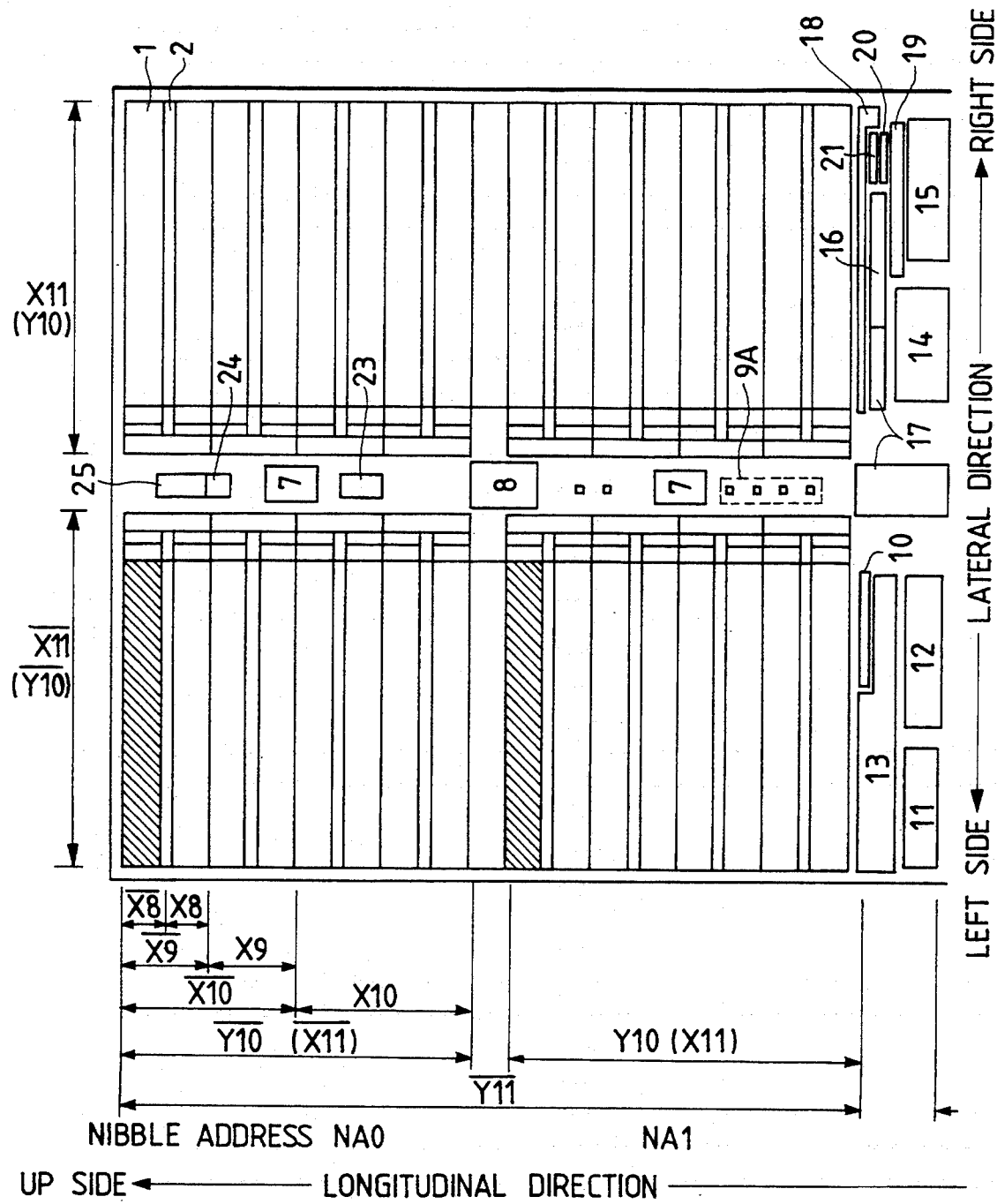
FIG. 2 is a block diagram showing the layout of the components of the DRAM in a first block of the chip of FIG. 1.
Figure 3:
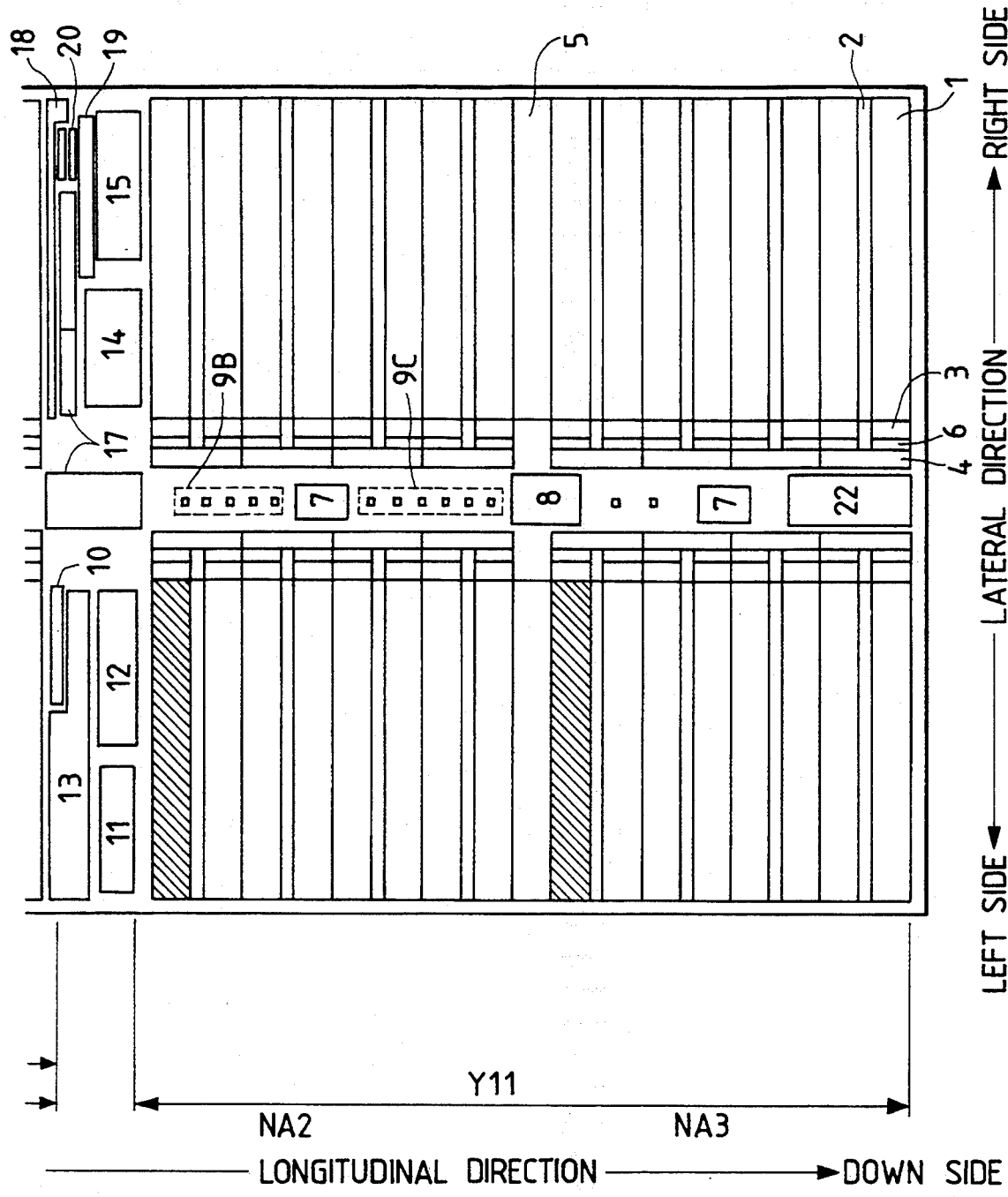
FIG. 3 is a block diagram showing the layout of the components of the DRAM in a second block of the chip of FIG. 1.

FIG. 1 shows a chip of a DRAM in a preferred embodiment according to the present invention, and FIGS. 2 and 3 show the actual geometric arrangement of the components of a first block and a second block, respectively, in the chip shown in FIG. 1.

The first and second blocks shown in FIGS. 2 and 3 are formed on a single semiconductor substrate, such as a single crystal silicon wafer, by known semiconductor integrated circuit fabricating processes. In the following description, insulated-gate field-effect transistors (IGFETs) are denoted by MOSFETs.

There are space restrictions on the layout of signal lines for transmitting control signals and memory array driving signals to arrange the components of a DRAM having a large storage capacity in a limited area, and long wiring lines reduces the operating speed of the DRAM. Accordingly, the present invention applies the following contrivance to the layout of the memory arrays and the peripheral circuits for addressing the memory arrays of the DRAM.

Referring to FIGS. 1 to 3, the chip is divided into four sections by a cross-shaped area consisting of a longitudinal central area and a lateral central area. The peripheral circuits are arranged in the cross-shaped area, and four memory arrays are arranged respectively in the four sections. In this embodiment, the storage capacity of each memory array is 4 Mb, and the total storage capacity of the DRAM is about 16 Mb. In each of the memory mats 1 of the memory arrays, word lines extend laterally and a pair of parallel complementary data lines are extended longitudinally. A pair of memory mats 1 are disposed on the opposite sides of a sense amplifier 2 to use the sense amplifier 2 as a shared sense amplifier common to the pair of memory mats 1 on the opposite sides thereof. A Y-selection circuit 5 is extended laterally in the longitudinally middle portion of each of the four memory arrays. Y-selection lines connected to the Y-selection circuit 5 are extended over the plurality of memory mats 1 of the corresponding memory array for the switching control of the gates of the MOSFETs for switching the columns of the memory mats 1.

An X-system circuit 12 consisting of an X-address buffer and an X-address driver (logical unit), an X-redundant circuit 11, a RAS-system control signal circuit 10 and a self-refreshing timer circuit 13 are arranged in the left half of the lateral central area. The X-system circuit 12 is nearer to the center of the chip than the X-redundant circuit 11. The self-refreshing timer circuit 13 defines refreshing time on the basis of the storage capacity of the memory cells and the worst time of leak of charge into the substrate to limit the number of refreshing cycles to the least necessary value to suppress the power consumption of the DRAM.

A Y-system circuit 14 consisting of a Y-address buffer and a Y-address driver (logic unit), a Y-redundant circuit 15, an internal voltage step-down circuit 17 for providing a supply voltage VCL for peripheral circuits including control signal generating circuit 18 for generating control signals for controlling a CAS system, a WE system and a test system, a reference voltage generating circuit 16, address buffers and decoders, a ½ VCL generating circuit 20 for generating a precharging voltage ½ VCL corresponding to the potential of the plate electrodes of the memory cells and the precharging potential of bit lines, and a SETB circuit 21 for detecting an external supply voltage VCC and a substrate voltage VBB and providing a signal indicating an operative state are arranged in the right half of the lateral central area. The Y-system circuit 14 is nearer to the center of the chip than the Y-redundant circuit 15.

The internal voltage step-down circuit 17 is nearer to the center of the chip than the reference voltage generating circuit 16, and the internal voltage step-down circuit 17 excluding the phase compensating capacitor thereof is disposed within the central portion of the chip corresponding to the intersection of the longitudinal central area and the lateral central area. When an external supply voltage VCC of about 5 V is applied to the reference voltage generating circuit 16, the reference voltage generating circuit 16 provides a fixed reference voltage VL of about 3.3 V.

Since the address buffers that affect the address time directly are disposed in the central portion of the chip in which address predecoding signal lines and control signal lines are concentrated, and the redundant circuits including address comparators having a relatively large area are disposed farther from the center of the chip than the address buffers, the address predecoding signal lines and the control signal lines are comparatively short.

Since the internal voltage step-down circuit 17 is disposed nearer to the center of the chip than a substrate voltage generating circuit 19, and the internal voltage step-down circuit 17 excluding the internal phase compensating capacitor having a comparatively large area is disposed within the central portion of the chip, the internal voltage step-down circuit 17 and the substrate voltage generating circuit 19 are hardly subject to the effect of coupling noise. Particularly, the substrate voltage generating circuit 19 is disposed so as to avoid being affected by coupling noise, the circuits are able to function on a comparatively low current and the internal voltage step-down circuit 17 is able to supply power efficiently to the peripheral circuits.

The RAS-system control circuit 10 activates the X-address buffer upon the reception of a signal RAS. An address signal stored in the X-address buffer is given to the X-redundant circuit 11. The X-redundant circuit 11 compares the address signal with a stored faulty address to decide whether or not the X-redundant circuit 11 is to be switched. Then, the result of comparison and the address signal are given to an X-predecoder, the X-predecoder gives a predecoded signal through the X-address driver of the corresponding memory array to an X-decoder 3 provided for the memory mat 1.

An internal signal of the RAS system is given to the control circuit of the WE system and the control circuit of the CAS system. For example, an automatic refresh mode CBR and a test mode WCBR are identified on the basis of the input sequence of the RAS signal, the CAS signal and the WE signal. In the test mode WCBR, the test circuit is activated to set test functions according to a specified signal given to the test circuit.

The test system control signal generating circuit 18 receives the signal CAS and generates control signals for controlling the Y-system circuit. An address signal stored in the Y-address buffer when the signal CAS goes LOW is given to the Y-redundant circuit 15. The Y-redundant circuit 15 compares the address signal with a stored faulty address and decides whether or not the Y-redundant circuit is to be switched. Then, the result of comparison and the address signal are given to the Y-predecoder and the Y-predecoder provides a predecoded signal. The predecoded signal is given to Y-decoders through a Y-address driver provided for the four memory arrays. The test system control signal generating circuit 18 receives the RAS signal and the WE signal and determines a desired mode on the basis of the input sequence of the RAS signal and the WE signal. When the test mode is selected, the test circuit is activated.

Sixty-four memory mats 1 and thirty-two sense amplifiers 2 each combined with two adjacent memory mats 1 are divided into four longitudinally arranged groups. Each group comprises sixteen memory mats 1 and eight sense amplifiers 2 arranged symmetrically with respect to the longitudinal center axis of the longitudinal central area. Four amplification units 7 each consisting of four main amplifiers are disposed in the longitudinal central area and combined respectively with the four groups of the memory mats 1 and sense amplifiers 2.

An input pad area 9A for receiving address signals and control signals is formed in the upper half of the longitudinal central area, and a data output buffer circuits 23 and 25 and a data input buffer circuit 24 are disposed in the upper half of the longitudinal central area. Two internal voltage step-down circuits 8 are disposed in the longitudinal central area, and each internal voltage step-down circuit 8 is combined with the thirty-two memory mats 1 and sixteen sense amplifiers 2 to apply an operating voltage to the corresponding sense amplifiers 2. Accordingly, the sense amplifiers 2 of each group can be connected by comparatively short lines to the corresponding amplification unit 7.

A voltage step-up circuit 22 which receives a stepped-down voltage and provides a word line selecting voltage is disposed in the lower half of the longitudinal central area, and input pad areas 9B and 9C for receiving address signals and control signals are formed in the lower half of the longitudinal central area.

A plurality of bonding pads including bonding pads to be connected to an external power supply are arranged in the longitudinal central area in portions other than the pad areas 9A, 9B and 9C. Ten and odd grounding pads to be connected to a ground are arranged substantially linearly to increase input level margin, i.e., to reduce power supply impedance. Therefore, the power supply impedance is reduced. Since the grounding lines interconnecting the plurality of kinds of internal circuits are connected by a low-pass filter consisting of a LOC lead frame and bonding wires, noise is suppressed to the least extent, and the propagation of noise through the grounding lines interconnecting the internal circuits can be suppressed to the least extent.

The external supply voltage VCC of about 5 V is applied to the pads connected to the internal voltage step-down circuits 8 and 17 to reduce power supply impedance and to suppress the propagation of noise of the voltages (VCC, VDL and VCL) across the internal circuits.

Address signal input pads A0 to A11, and the input pads for control signals including the RAS signal, the CAS signal, the WE signal and the OE signal are arranged in the input pad areas 9A to 9C. Also arranged in the longitudinal central area are data input pads, data output pads, pads for bonding master, pads for monitoring and pads for controlling the monitoring pads. The pads for bonding master are those for specifying a static column mode and those for specifying write mask functions in a nibble mode and when forming X4 bits. The pads for monitoring is used for monitoring the internal voltages VCL, VDL, VL, VBB, VCH and VPL.

The internal voltage VCL is a supply voltage of about 3.3 V generated by the internal voltage step-down circuit 17 for the peripheral circuits. The internal voltage VDL is a supply voltage of about 3.3 V to be applied to the sense amplifiers 2 of the memory arrays. The voltage VDL is generated by the two voltage step-down circuits 8 combined respectively with the two upper groups of memory mats 1 and the sense amplifiers 2, and the two lower groups of the memory mats 1 and the sense amplifiers 2. VCH is a boost supply voltage of about 5.3 V generated by stepping up the internal voltage VCL, to be used for selecting word lines, the level of selecting mat selecting switch MOSFETs of a shared sense amplifier system and shared switch MOSFETs. VBB is a substrate back biasing voltage of $-2$ V, VPL is the plate voltage of the memory cells, and VL is a fixed voltage of about 3.3 V to be applied to the internal voltage step-down circuits 8 and 17.

The storage capacity of the DRAM is about 16 Mb. The address signals are supplied in an address multiplex system, in which the X-address signal and the Y-address signal are supplied in a time series in synchronism with the address strobe signals RAS and CAS. The X-address signal has twelve bits X0 to X11, and the Y-address signal has twelve bits Y0 to Y11.

In FIGS. 2 and 3, the X-address signal of bits X0 to X11 is a true signal which indicates a selection mode when the external address signal is HIGH, and the X-address signal of bits X0B to X11B is a bar signal which indicates a selection mode when the external address signal is LOW. Similarly, the Y-address signal of bits Y0 to Y11 is a true signal which indicates a selection mode when the external address signal is HIGH, and the Y-address signal of bits Y0B to Y11B is a bar signal which indicates a selection mode when the external address signal is LOW.

The sense amplifier 2, the pair of memory mats 1 disposed respectively on the opposite sides of the sense amplifier 2, the X-decoder 3 and a mat control signal generating circuit 4 constitute a unit memory circuit. The DRAM has the longitudinally arranged four memory groups each having the eight memory units arranged symmetrically with respect to the longitudinal center axis of the longitudinal central area. The memory groups are specified by the address signals Y10 and Y11 of the upper two bits; that is, the first and second blocks of the chip are specified by the address signals Y11 and Y11B of the uppermost (or most significant) bits, and the two memory groups of each block are specified by the Y10 and Y10B of the bits subsequent to the uppermost bits.

Each of the four memory groups is divided into right half memory group and a left half memory group by the uppermost bits X11 and X11B, which are used as signals for selecting the memory mats 1 of the right half memory group or the memory mats 1 of the left half memory group to be connected to the amplification unit 7. The address signals X10 and X10B, and X9 and X9B of the bits subsequent to the uppermost bits are used for specifying the eight unit memory circuits of each memory group. The address signals X8 and X8B are used as selection signals for selecting one of the pair of memory mats 1 to be connected to the associated sense amplifier 2.

Each memory mat 1 of the unit memory circuit is provided with 256 word lines. Since the sense amplifier 2 is combined with the pair of memory mats 1, memory cells corresponding to 512 word lines are allocated to each sense amplifier. The address signals X8 and X9B are used for specifying the memory cells in the pair of memory mats 1. Accordingly, the X-decoder 3 decodes an address signal of nine bits X0 to X8 to select one of the word lines.

When the X-address signal is received in synchronism with a low address strobe signal RAS, an X-system selecting operation is carried out, in which either the left sections or the right sections are selected according to the bits X11 and X11B of the X-address signal, one of the memory mats is selected according to the bits X10, X10B, X9, X9B, X8 and X8B of the X-address signal, and one of the 256 word lines is selected according to the eight bits X0 to X7 of the X-address signal.

The Y-decoder 5 of each memory array decodes the bits Y2 to Y9 of the Y-address signal to select the complementary data line of the memory mat 1; that is the Y-decoder 5 decodes the eight bits Y2 to Y9 of the Y-address signal to select one of the 256 addresses. The column select circuit selects the complementary data line by four bits. Therefore, the storage capacity of each memory array is $512 \times 256 \times 4 \times 8 = 4,194,304$ bits, about 4 Mb. Therefore, the storage capacity of the DRAM is about 16 Mb.

One of the four amplification units is specified by the bits Y0 and Y1 of the Y-address signal, and one of the memory groups, i.e., one of the four main amplifiers of the amplification unit 7, is specified by the bits Y10 and Y11 of the Y-address signal. Thus, one of the sixteen memory mats is activated by the four bits Y0, Y1, Y10 and Y11 of the Y-address signal to send out a signal of one bit through the data output buffer circuit 25. When accessing the memory by four bits, the bits Y10 and Y11 are nullified and the output signals of the four main amplifiers specified by the bits Y0 and Y1 among those of the four amplification units 7 may be provided in parallel. In a read operation in a nibble mode, four bits may be provided in a serial output mode by making the main amplifier function sequentially in order corresponding to that of the bits Y0, Y1, Y10 and Y11.

Figure 5:
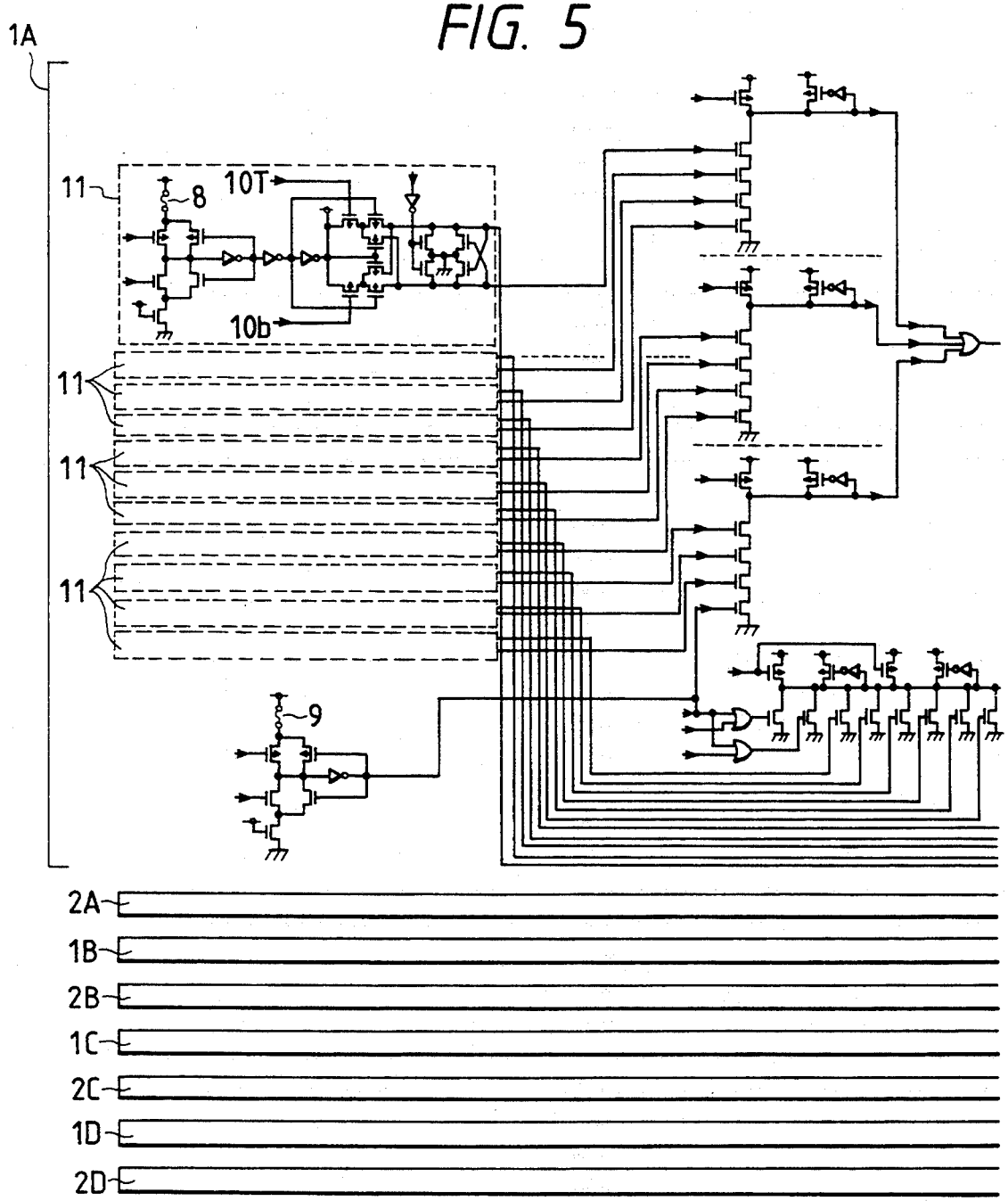
FIG. 5 is circuit diagram of a first block of the X-redundant circuit of FIG. 4.
Figure 6:
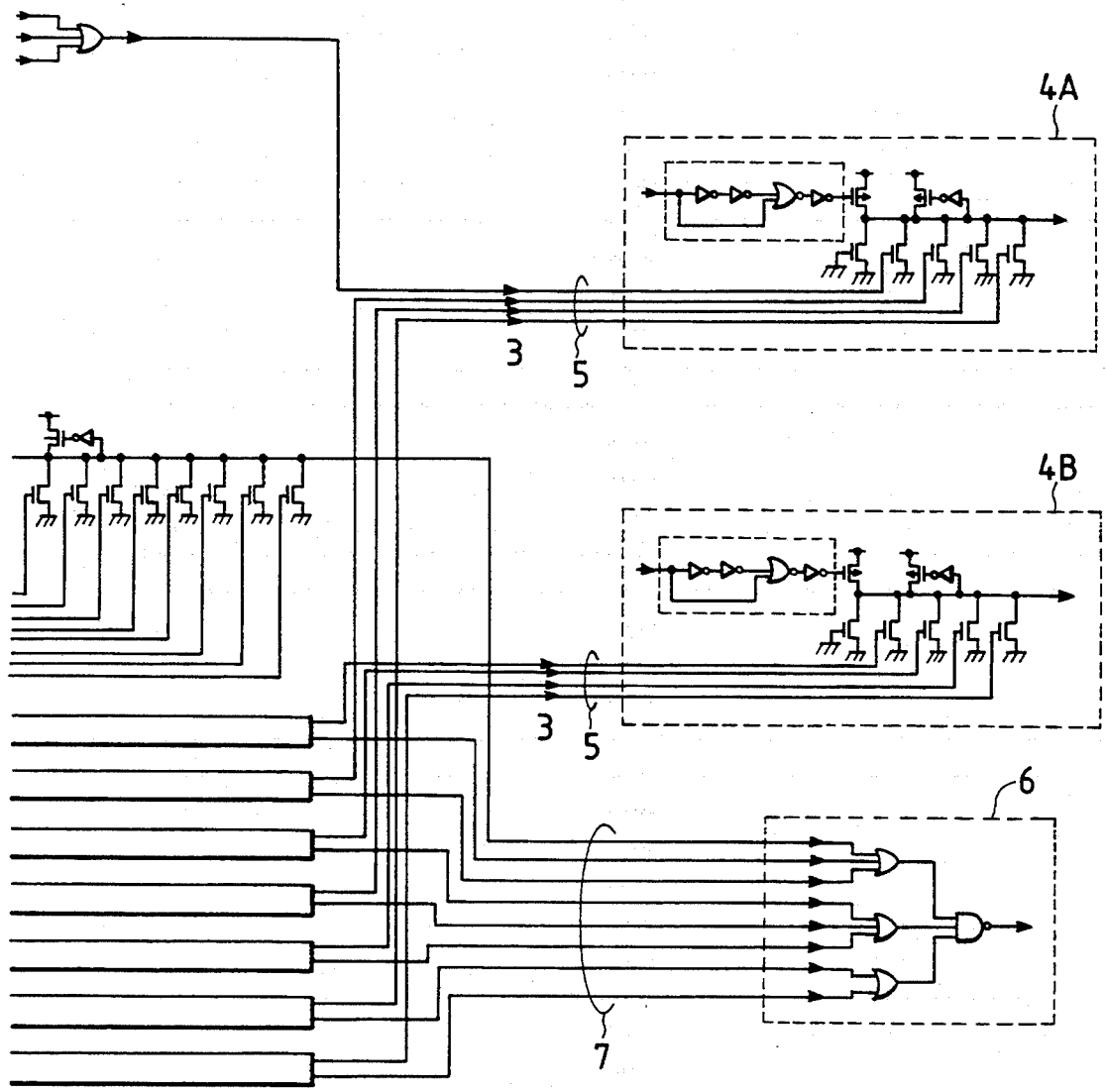
FIG. 6 is a circuit diagram of a second block of the X-redundant circuit of FIG. 4.

FIG. 4 shows the layout of the first and second blocks of the X-redundant circuit, and FIGS. 5 and 6 are circuit diagrams of the first and second blocks, respectively, of the X-redundant circuit, in which the middle portion of the X-redundant circuit is duplicated.

As shown in FIGS. 5 and 6, the X-redundant circuit comprises eight redundant decoders 1A to 1D and 2A to 2D of the same configuration. Each redundant decoder is provided with eleven address comparators 11 respectively corresponding to twelve addresses A1 to A11. Each address comparator 11 is assigned to the adjacent two redundant word lines of the memory mat 1. Since each memory mat 1 has four redundant word lines, two pairs of defective word lines, i.e., four defective word lines, of each memory mat 1 can be relieved. The pair of redundant word lines are selected by selecting either the redundant decoders 1A to 1D or 2A to 2D. The outer redundant word lines of the memory mat are used when the redundant decoders 1A to 1D are used, and the inner redundant word lines of the memory mat are used when the redundant decoders 2A to 2D are used.

The redundant decoder 1A becomes available when the enable fuse 9 of the redundant decoder 1A is broken. The redundant decoder 1A is provided with a fuse 8 for each X-address. The X-address to be relieved is determined by selectively breaking the eleven fuses with a laser beam. When X-addresses 10T and 10B to be relieved are given to the redundant decoder 1A, access information signals 3 are given to an activating circuit 4A for activating a driving circuit for driving the pair of redundant word lines to activate the pair of outer redundant word lines of the memory mat.

In the redundant decoder 2A, access information signals 3 are given to an activating circuit for activating a driving circuit for driving the pair of redundant word lines to activate the pair of inner redundant word lines of the memory mat. When either the redundant decoder 1A or the redundant decoder 2A uses the relief address, one of the signals 7 goes HIGH, to make a logic circuit 6 provide a signal for deactivating the word lines to be relieved.

Figure 7:
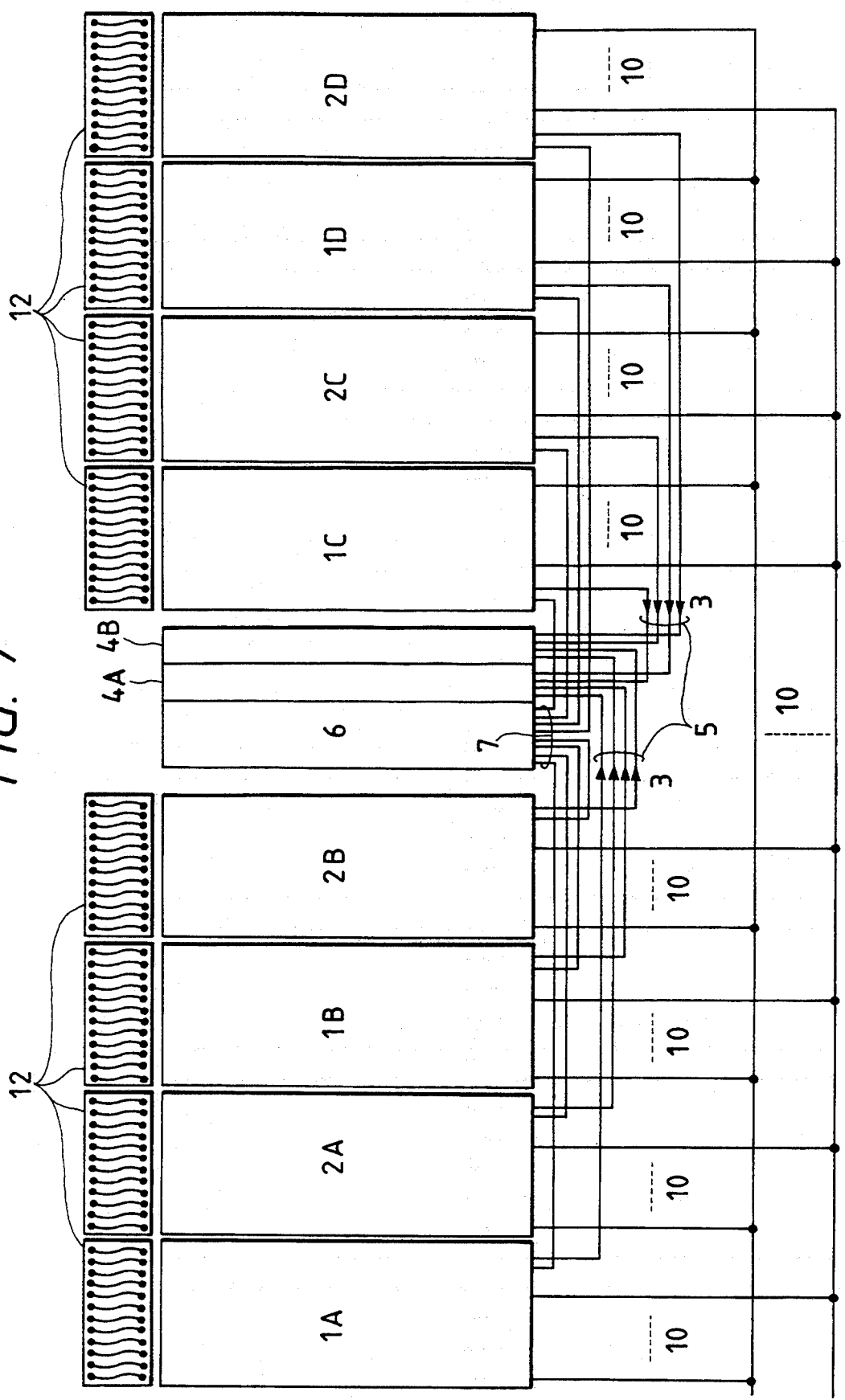
FIG. 7 is a diagrammatic view showing the layout of the X-redundant circuit of FIGS. 5 and 6.

Referring to FIG. 7 showing the layout of the components of the X-redundant circuit shown in FIGS. 5 and 6, the redundant decoders 1A to 1D and 2A to 2D are formed so that the redundant decoders corresponding to the pair of inner redundant word lines and those corresponding to the pair of outer redundant word lines are arranged alternately. If the redundant decoders 1A to 1D are arranged in one group and the redundant decoders 2A to 2D are arranged in another group, since the activating circuits 4A and 4B which receive the access information signals 3 from the redundant decoders and activate the driving circuits correspond respectively to the pair of outer redundant word lines and the pair of inner redundant word lines, signal lines 5 can be formed in a simple layout. However, since the fuses 8 of the redundant decoders need to be formed in a comparatively large area to avoid damaging the adjacent wiring lines when breaking the fuses 8, the eleven addresses must be compared with the address specified by the fuses 8 and the large-scale circuit needs a large area, the difference in the length of address signal lines 10 between the redundant decoders becomes large. Accordingly, the redundant decoders corresponding to the pair of outer redundant word lines and those corresponding to the pair of inner redundant word lines are arranged alternately so that the difference between the address signal lines and the difference between the access times is small.

Figure 8:
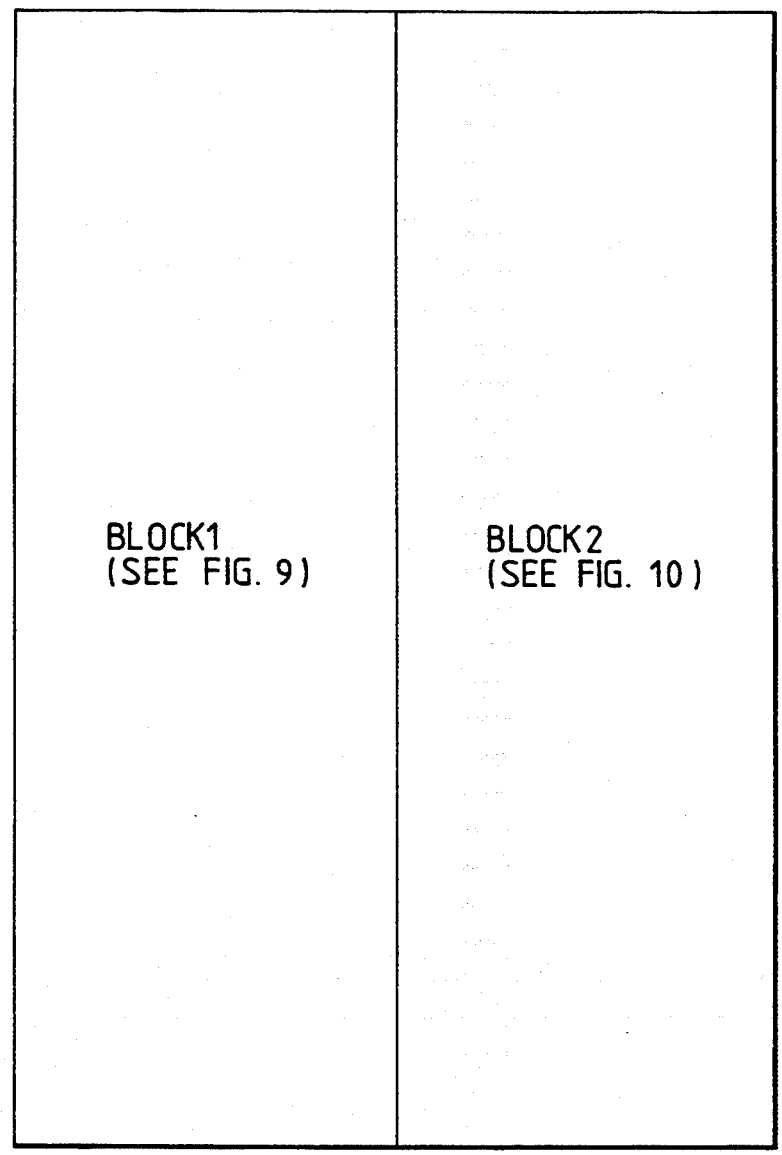
FIG. 8 is a view showing the layout of memory arrays and sense amplifiers in accordance with the present invention.
Figure 9:
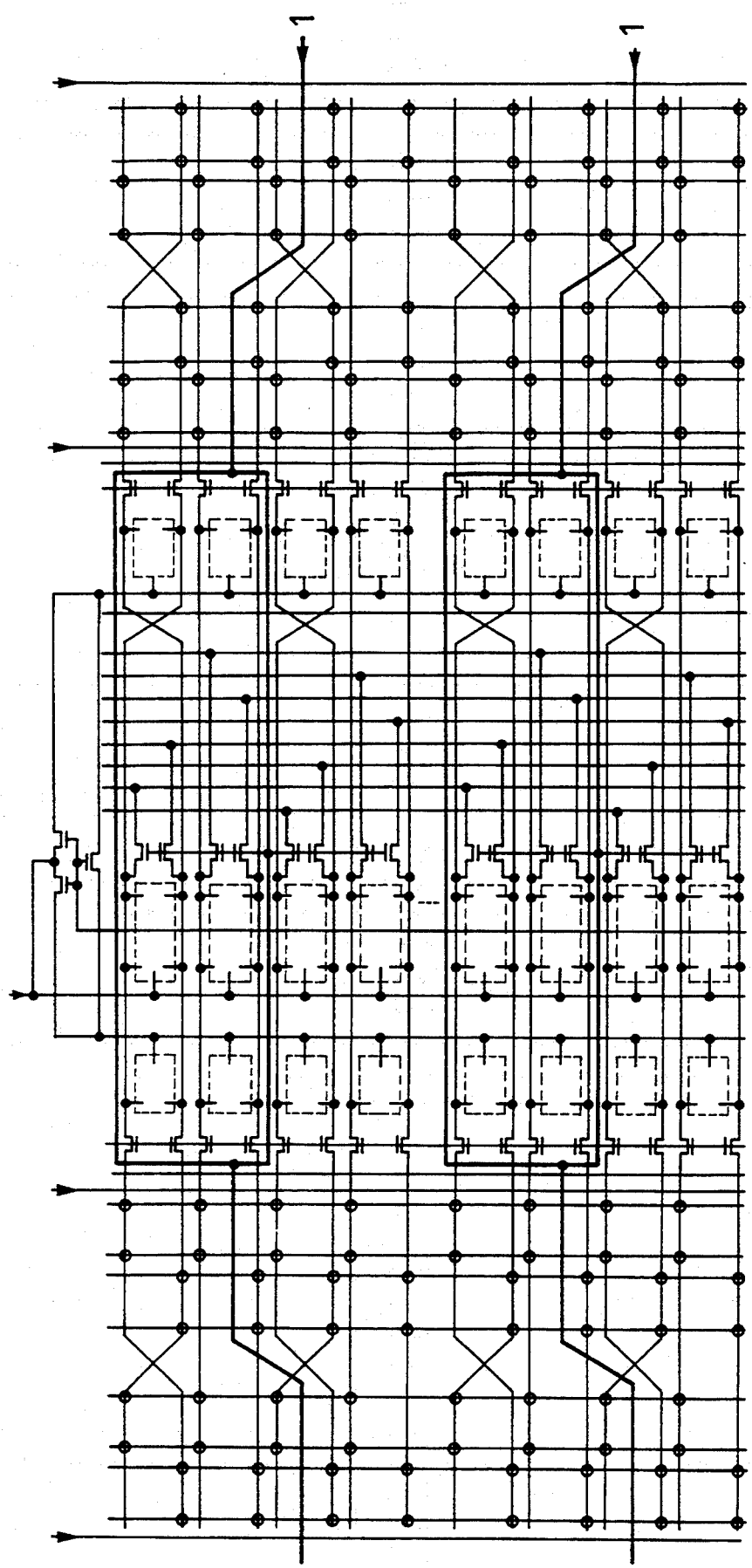
FIG. 9 is a circuit diagram showing the layout of a first block of FIG. 8.
Figure 10:
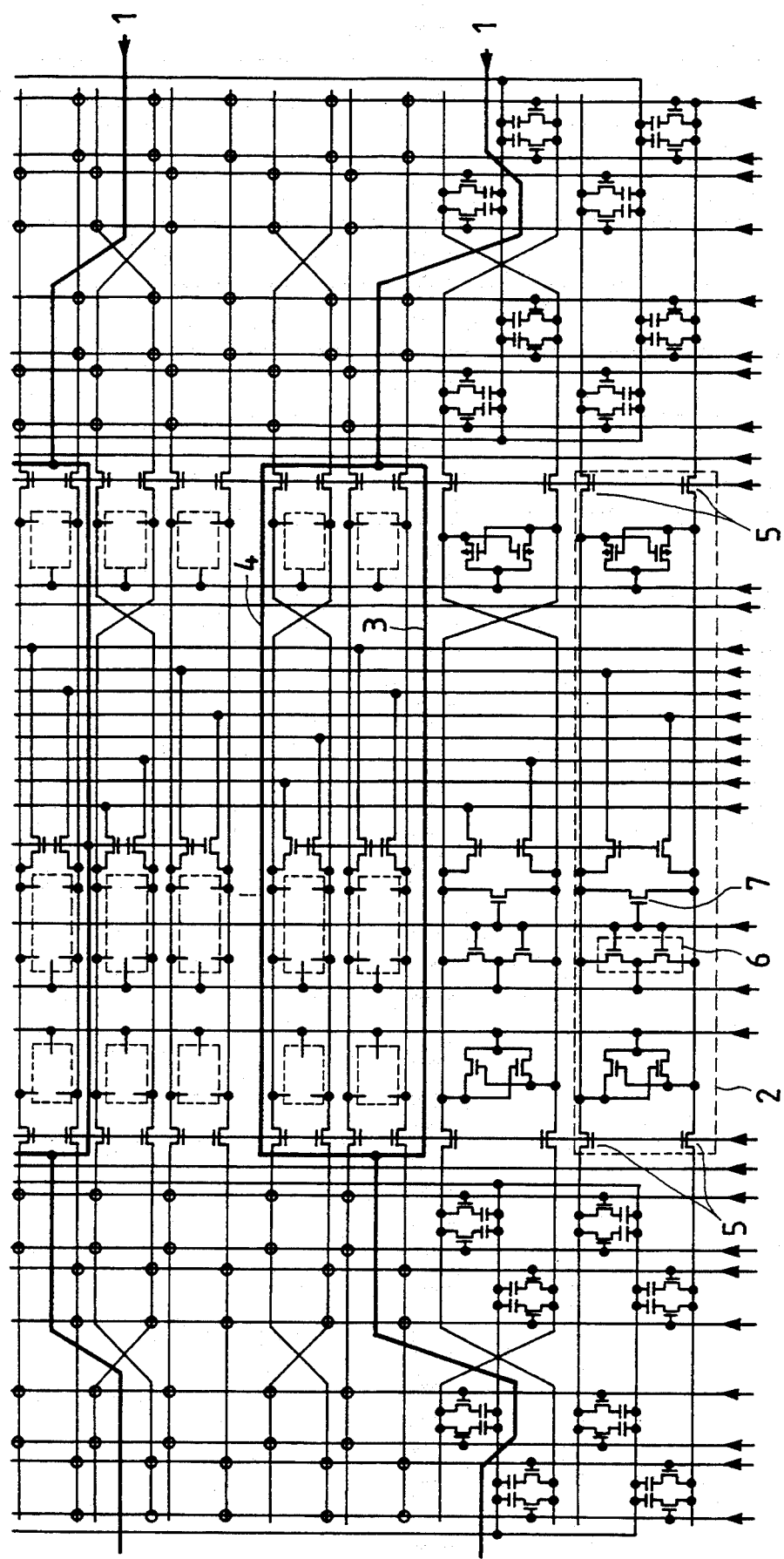
FIG. 10 is a circuit diagram showing the layout of a second block of FIG. 8.

FIG. 8 shows the layout of the memory arrays and the sense amplifiers of the DRAM of the present invention, FIGS. 9 and 10 show the layout of a first block in FIG. 8 and a second block in FIG. 8, respectively, in which the middle portion of the layout shown in FIG. 8 is duplicated.

Referring to FIGS. 9 and 10, Y-selection lines 1 connected to each Y-selection circuit extend over the plurality of memory mats of the corresponding memory array to control the switching operation of the gates of the MOSFETs as column switches. The Y-selection lines 1 are extended across the plurality of sense amplifiers. Since the Y-selection lines 1 are extended over the plurality of memory mats, it is desirable that the Y-selection lines 1 have a comparatively small resistance and hence the Y-selection lines 1 are formed of a metal. As is obvious from FIG. 7, the internal wiring of the sense amplifier 2 has many intersections. At least some of the intersections must be formed of a metal in a layer in which the Y-selection lines 1 are formed to arrange the wiring lines in a comparatively small area and to reduce the resistance of the wiring lines. The Y-selection lines 1 are extended between the sense amplifiers 2. Each Y-selection line 1 is branched into two branch lines in the area in which the sense amplifiers 2 are formed, one of the branch lines is extended through a gap 3 between the two pairs of sense amplifiers to be selected by the Y-selection line and connected to the gates of the MOSFETs, and the other branch line is extended through a gap 4 between the same group of four sense amplifiers and the adjacent group of four sense amplifiers.

Since the Y-selection line 1 is branched into the two branch lines in the sense amplifier area, the resistance of the wiring is comparatively small even though the sense amplifiers 2 are arranged closely in a comparatively small area. Since the branch lines are narrower than the Y-selection line 1 and are extended through gaps between the sense amplifiers 2, the branch lines can be arranged at uniform intervals relative to the pairs of data lines, and the reduction of data read margin attributable to the irregular resistance of the wiring lines and irregular capacity of the wiring lines can be prevented.

In FIGS. 9 and 10, the sense amplifiers 2 includes shared MOS transistors 5, data line precharging MOS transistors 6 and data line short-circuiting MOS transistors 7. The width of the gates of these transistors must be reduced according to the reduction of the pitches of the data lines, which entails the well known narrow-channel effect that increases the threshold voltage and reduces the operating speed of the transistors.

In this embodiment, the threshold voltage is lowered by about 0.2 V by introducing boron into the LOCOS portion and the near-surface element forming region of the substrate of the MOS transistors by ion implantation process using a high-energy ion beam, and any p-type channel stopper region is not formed under the LOCOS portion for the peripheral circuits.

Figure 11:
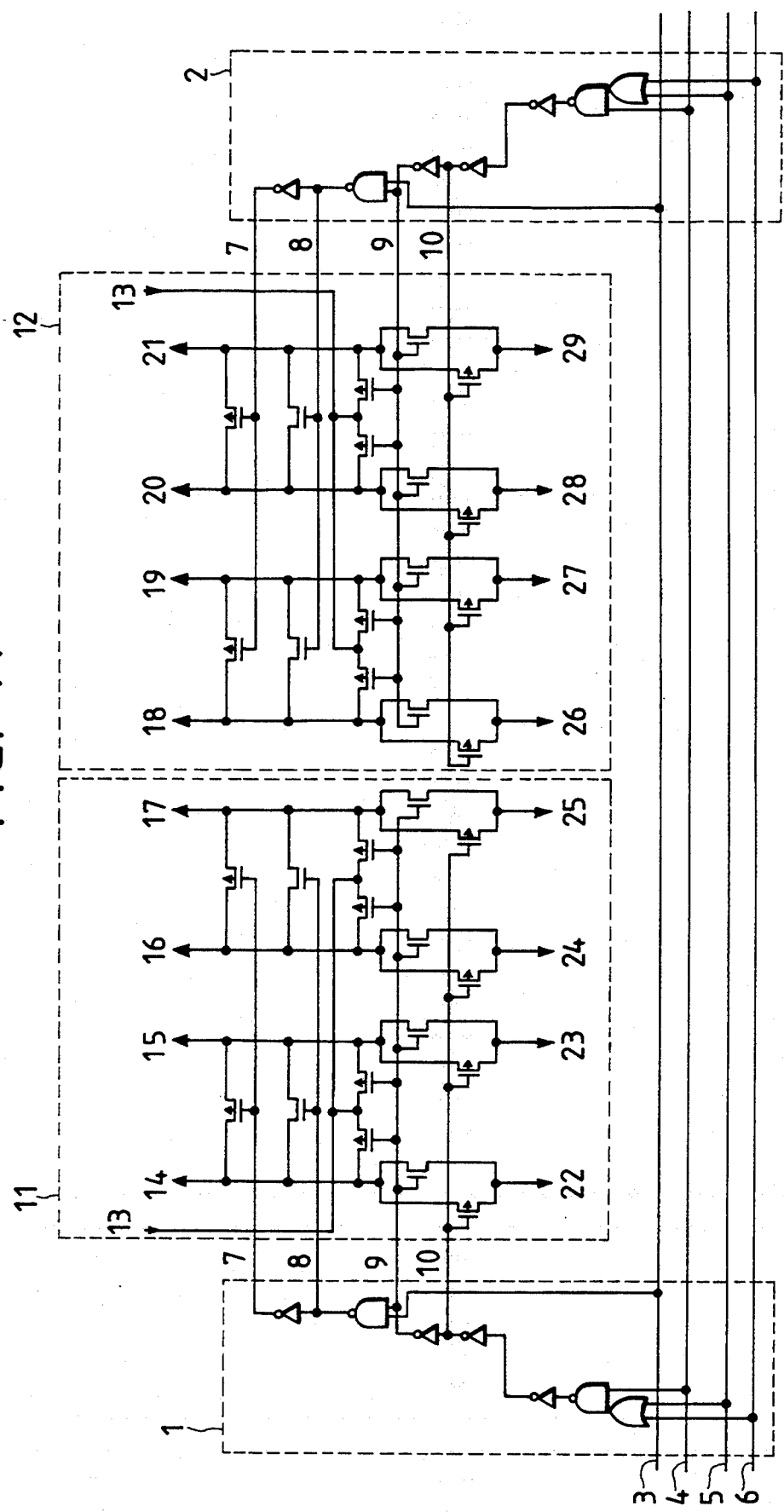
FIG. 11 is a circuit diagram of a control signal generating circuit in accordance with the present invention.

FIG. 11 shows a circuit comprising I/O line equalizing circuits for equalizing I/O lines connected to the sense amplifier, and a control signal generating circuit for generating control signals for controlling the I/O line equalizing circuits on the basis of mat control signals 3, 4, 5 and 6, i.e., Y-system control signals. In this embodiment, two logic circuits 1 and 2 of the same configuration are connected to four I/O line equalizing circuits, the output signals 7, 8, 9 and 10 of the logic circuit 1 are given to the two I/O line equalizing circuits 11, and the output signals 7, 8, 9 and 10 of the logic circuit 2 are given to the two I/O line equalizing circuits 12. The four pairs of I/O lines 14 to 21 are the nodes of the memory mat, and the I/O lines 22 to 29 are the nodes of a common I/O. Denoted by 13 are precharging potentials provided by the ½ VCL generating circuit (FIGS. 1, 2 and 3). The logic circuits 1 and 2 precharge the I/O lines while the DRAM is on standby, and equalize the I/O lines before I/O operation.

Figure 12:
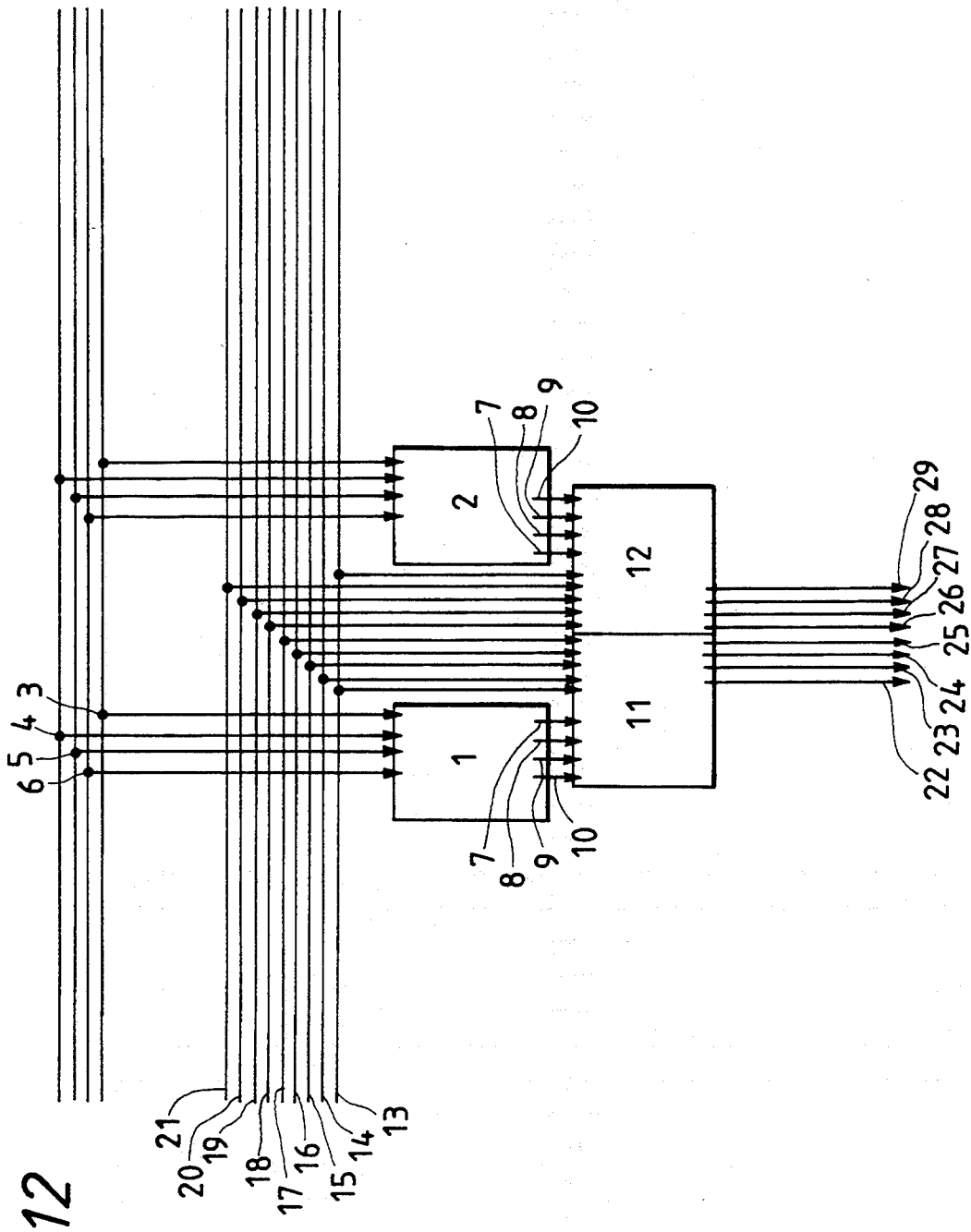
FIG. 12 is a diagrammatic view showing the layout of the control signal generating circuit of FIG. 11.

The layout of the circuit shown in FIG. 11 is shown in FIG. 12, in which parts corresponding to those shown in FIG. 11 are denoted by the same reference characters. Referring to FIG. 12, lines 3 to 6 and lines 13 to 21 are extended longitudinally in the longitudinal central area of the chip. Lines 22 to 29 are extended within the sense amplifier. Since the I/O lines 14 to 21 are extended through the space between the logic circuits 1 and 2, lines connecting the outputs 7 to 10 of the logic circuits 1 and 2 respectively to the I/O line equalizing circuits 11 and 12 do not intersect the I/O lines 14 to 21. Accordingly, any wiring channel region does not need to be secured and hence the chip can be formed in a comparatively small area. The possibility of disposing the logic circuits 1 and 2 independently of the wiring channel region for the outputs 7 to 10 increases the degree of freedom of layout.

Figure 13:
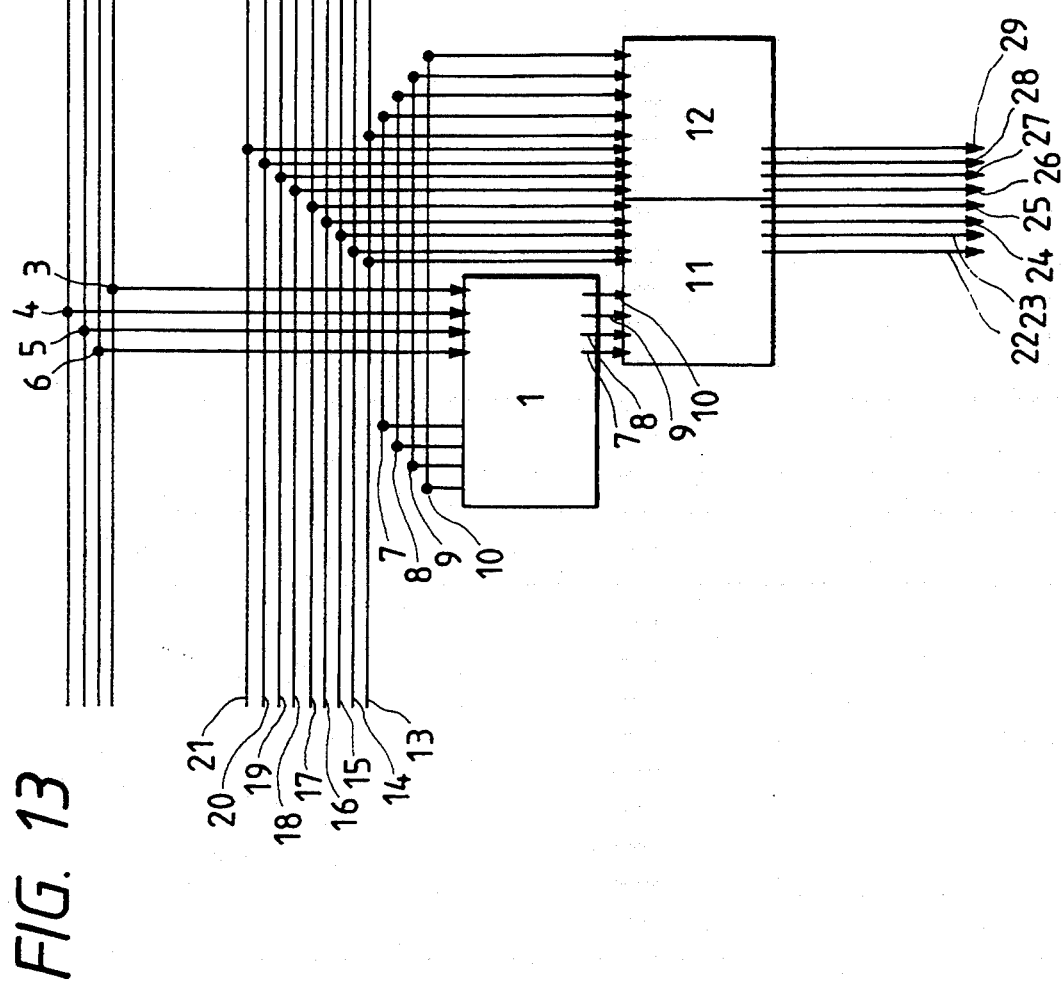
FIG. 13 is a diagrammatic view showing the layout of another control signal generating circuit in accordance with the present invention.

FIG. 13 shows the layout of a modification of the circuit shown in FIG. 11. In this modification, the logic circuit 2 of the circuit shown in FIG. 11 is omitted, and the outputs 7 to 10 of a single logic circuit 2 corresponding to the logic circuit 2 of the circuit shown in FIG. 11 are connected to both I/O line equalizing circuits 11 and I/O line equalizing circuits 12. The wiring channel region of this modification is greater than that of the circuit of FIG. 11 by an area for four lines. Since the circuit of FIG. 13 is thus provided only the single logic circuit 1, increase in the area of a wiring region for the lines connecting the outputs 7 to 10 of the logic circuit 1 to the I/O line equalizing circuits 11 and 12 can be avoided, and the lines connecting the outputs 7 to 10 of the logic circuit 1 to the I/O line equalizing circuits 11 and 12 can be formed of a metal having a comparatively high resistivity, such as tungsten, without entailing significant reduction in the operating speed.

As is apparent from the foregoing description, the present invention has the following effects.

(1) A DRAM comprises a plurality of memory blocks of a shared sense amplifier system, each memory block comprises a plurality of sets each of memory mats consisting of a plurality of dynamic memory cells arranged in a matrix and a sense amplifier for amplifying infinitesimal read signals read from the memory cells; a selecting means for selecting either a condition for sending out or a condition for not sending out the read signal provided by each sense amplifier on an I/O line; Y-selection lines for transmitting selection signals; and a decoding circuit for determining the condition of the Y-selection lines, disposed substantially at the middle of the Y-selection lines. In this configuration, since the distance from the decoder to the far end of the Y-selection line is comparatively short, the resistance of the Y-selection lines may be comparatively high and the DRAM can be formed in a comparatively small chip without sacrificing the access time.

(2) Peripheral circuits are formed in a cross-shaped area consisting of a longitudinal central area longitudinally extending so as to divide the surface of the chip into equal right and left sections, and a lateral central area laterally extending so as to divide the surface of the chip into equal upper and lower sections, the memory arrays are disposed in the four sections demarcated by the cross-shaped area, X- and Y-address buffers and X- and Y-redundant relief circuits are arranged in the lateral central area, the X- and Y-address buffers and the X- and Y-redundant relief circuits are disposed close to each other in the central portion of the cross-shaped area. Thus the memory cells can be accessed in a comparatively short access time.

(3) The DRAM is provided with a reference voltage generating circuit for generating a specified reference voltage and an output buffer serving as a voltage follower to provide a supply voltage and a supply current for the operation of the internal circuits, the reference voltage generating circuit and the output buffer are disposed in the peripheral circuit area in the lateral central area, and the reference voltage generating circuit is disposed nearer to the edge of the chip than the output buffer. An internal voltage step-down circuit is disposed nearer to the central portion of the chip than the reference voltage generating circuit, and the internal voltage step-down circuit excluding its internal phase compensating capacitor requiring a relatively large space for arrangement is formed within the central area of the cross-shaped area, the internal voltage step-down circuit and the reference voltage generating circuit are not affected significantly by an address predecoding signal and coupling noise generated by control signal lines. Since the reference voltage generating circuit, in particular, is formed at a position where the same is hardly subject to coupling noise, circuits capable of operating on a small current can be used and the internal voltage step-down circuit is able to supply power efficiently to the peripheral circuits.

(4) Each memory mat is provided with a plurality of redundant lines and a relief circuit for selecting the redundant line of the memory mat for relieving. Therefore, the difference between the redundant lines of each memory mat in access time is small.

(5) At least some of wiring lines connected to the sense amplifiers are formed in a wiring layer for the Y-selection lines, and the Y-selection lines are extended through gaps between the sense amplifiers. Therefore, the resistance of the Y-selection lines is not very large even if the area for the Y-selection lines is comparatively narrow and hence the DRAM can be formed in a comparatively small chip without sacrificing the access time. The areas for extending the Y-selection lines can be secured without entailing reduction in data reading margin attributable to the deformation of the symmetrical layout of the sense amplifiers.

(6) Increase in the threshold voltage caused by a narrow channel effect due to the miniaturization of the shared MOS transistors and the bit line precharging n-channel MOS transistors through the reduction of intervals between the data lines can be compensated and operation margin can be secured by using the same kind of impurity ions as that used for forming the memory cells for forming the shared MOS transistors and the bit line precharging n-channel MOS transistors.

(7) The width of the longitudinal central area for the peripheral circuits and the size of the chip can be reduced by using a plurality of logic circuits of the same configuration for generating I/O line equalizing signals on the basis of a mat control signal and simultaneously giving the I/O line equalizing signals to I/O line equalizing circuits.

The present invention is not limited to the embodiment specifically described herein and many changes and variations are possible therein.

For example, the configuration of the Y-redundant circuit may be the same as the configuration of the X-redundant circuit shown in FIGS. 4 to 7; more than two Y-selection lines may be extended through gaps between the adjacent sense amplifiers instead of extending two Y-selection lines through the same as shown in FIGS. 9 and 11; all the Y-selection lines need not necessarily be formed of the same material; and the type of ions and the dose of ions for ion implantation when forming the shared MOS transistors 5, the data line precharging MOS transistors 6 and the data line short-circuiting MOS transistors 7 need not necessarily be the same as those for ion implantation when forming the memory cells.

The layout of the components and the peripheral circuits of the DRAM may be some other layout than that shown in FIGS. 1 to 3. Although the present invention has been described as applied to a large-scale DRAM, the present invention is applicable also to various other memories including static RAMs and ROMs (read-only memories).

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A semiconductor integrated circuit device formed in a single chip, comprising:
   first and second memory blocks each comprising a first selection line, a second selection line and a plurality of memory units, each of said plurality of memory units comprising:
   (a) a first memory mat including:
      (1) a pair of first data lines, (2) a pair of second data lines, and
(3) a plurality of first memory cells each of which is coupled to a corresponding one line of said first and second data lines;
(b) a second memory mat including:
(1) a pair of third data lines,
(2) a pair of fourth data lines, and
(3) a plurality of second memory cells each of which is coupled to a corresponding one line of said third and fourth data lines;
(c) a pair of first lines coupled to said pair of first data lines and said pair of third data lines;
(d) a pair of second lines coupled to said pair of second data lines and said pair of fourth data lines;
(e) a pair of transmitting lines;
(f) first switch means for coupling said pair of first lines to said pair of transmitting lines in accordance with a first selection signal transmitted by said first selection line;
(g) second switch means for coupling said pair of second lines to said pair of transmitting lines in accordance with a second selection signal transmitted by said second selection line;
(h) a first sense amplifier coupled to said pair of first lines; and
(i) a second sense amplifier coupled to said pair of second lines,
a selecting circuit, disposed in a first plan view area on a main surface of the chip substantially central to both of said first memory block and said second memory block, being coupled to said first selection lines of said first and second memory blocks and coupled to the second selection lines of said first and second memory blocks,
wherein said selecting circuit selects said first selection lines in said first and second memory blocks at the same time and selects said second selection lines of said first and second memory blocks at the same time,
wherein said pair of first lines, said pair of second lines, said pair of transmitting lines, said first switch means, said second switch means, said first sense amplifier and said second sense amplifier are formed in a second plan view area on the main surface of the chip corresponding to a spacing between said first memory mat and said second memory mat,
wherein each of said first selection lines of said first and second memory blocks are branched into two branch lines in at least one portion in said second plan view area, and
wherein each of said second selection lines of said first and second memory blocks are branched into two branch lines in at least one portion in said second plan view area.

2. A semiconductor integrated circuit device according to claim 1,
wherein said first switch means comprises a first switch coupled between one of said pair of first lines and one of said pair of transmitting lines and a second switch coupled between the other one of said pair of first lines and the other one of said pair of transmitting lines, and
wherein said second switch means comprises a third switch coupled between one of said pair of second lines and one of said pair of transmitting lines and a fourth switch coupled between the other one of said pair of second lines and the other one of said pair of transmitting lines.

3. A semiconductor integrated circuit device according to claim 2,
wherein each of said first and second switches is comprised of a MOSFET, each said MOSFET having a gate for receiving said first selection signal and having a source-drain path coupled between a corresponding one of said pair of first lines and a corresponding one of said pair of transmitting lines, and
wherein each of said third and fourth switches is comprised of a MOSFET, each said MOSFET having a gate for receiving said second selection signal and having a source-drain path coupled between a corresponding one of said pair of second lines and a corresponding one of said pair of transmitting lines.

4. A semiconductor integrated circuit device according to claim 2,
wherein each of said first and second sense amplifiers is shared by said first and second memory mats,
wherein said first sense amplifier comprises:
a first p-channel MOSFET having a source-drain path coupled between a first supply voltage and one of said pair of first lines and a gate coupled to the other one of said pair of first lines;
a first n-channel MOSFET having a source-drain path coupled between a second supply voltage and said one of said pair of first lines and a gate coupled to the other one of said pair of first lines;
a second p-channel MOSFET having a source-drain path coupled between said first supply voltage and said gate of said first p-channel MOSFET and having a gate coupled to said one of said pair of first lines; and
a second n-channel MOSFET having a source-drain path coupled between said second supply voltage and said gate of said first n-channel MOSFET and having a gate coupled to said one of said pair of first lines, and
wherein said second sense amplifier comprises:
a third p-channel MOSFET having a source-drain path coupled between said first supply voltage and one of said pair of second lines and a gate coupled to the other one of said pair of second lines;
a third n-channel MOSFET having a source-drain path coupled between said second supply voltage and said one of said pair of second lines and a gate coupled to the other one of said pair of second lines;
a fourth p-channel MOSFET having a source-drain path coupled between said first supply voltage and said gate of said third p-channel MOSFET and having a gate coupled to said one of said pair of second lines; and
a fourth n-channel MOSFET having a source-drain path coupled between said second supply voltage and said qate of said third n-channel MOSFET and having a gate coupled to said one of said pair of second lines.

5. A semiconductor integrated circuit device according to claim 3,
wherein said MOSFET in each of said first and second switch means is of n-channel conductivity type.

6. A semiconductor integrated circuit device according to claim 4,
wherein one of said two branch lines in that portion of said second plan view area in which said first sense amplifier area is disposed is coupled to said first and second switches, and
wherein one of said two branch lines in that portion of said second plan view area in which said second sense amplifier area is disposed is coupled to said third and fourth switches.

7. A semiconductor integrated circuit device according to claim 6,
wherein at least one of internal wirings of said first sense amplifier and said first selection line are formed in a same layer, and
wherein at least one of internal wirings of said second sense amplifier and said second selection line are formed in a same layer.

8. A semiconductor integrated circuit device according to claim 6,
wherein the internal wirings of said first sense amplifier, the internal wirings of said second sense amplifier, said first selection line and said second selection line are formed of metal wirings.

9. A semiconductor integrated circuit device according to claim 3,
wherein one of said two branch lines in said first sense amplifier area is coupled to the gates of said MOSFETs in said first switch means, and
wherein one of said two branch lines in said second sense amplifier area is coupled to the gates of said MOSFETs in said second switch means.

10. A semiconductor integrated circuit device according to claim 9,
wherein said MOSFET in each of said first and second switch means is of n-channel conductivity type.

11. A semiconductor integrated circuit device according to claim 4,
wherein each of said first and second switches is comprised of a MOSFET, each said MOSFET having a gate for receiving said first selection signal and having a source-drain path coupled between a corresponding one of said pair of first lines and a corresponding one of said pair of transmitting lines, and
wherein each of said third and fourth switches is comprised of a MOSFET, each said MOSFET having a gate for receiving said second selection signal and having a source-drain path coupled between a corresponding one of said pair of second lines and a corresponding one of said pair of transmitting lines.

12. A semiconductor integrated circuit device according to claim 8,
wherein each of said first and second switches is comprised of a MOSFET, each said MOSFET having a gate for receiving said first selection signal and having a source-drain path coupled between a corresponding one of said pair of first lines and a corresponding one of said pair of transmitting lines, and
wherein each of said third and fourth switches is comprised of a MOSFET, each said MOSFET having a gate for receiving said second selection signal and having a source-drain path coupled between a corresponding one of said pair of second lines and a corresponding one of said pair of transmitting lines.

13. A semiconductor integrated circuit device according to claim 12,
wherein said MOSFET in each of said first and second switch means is of n-channel conductivity type.

* * * * *